United States Patent
Abe et al.

(10) Patent No.: US 6,747,529 B2
(45) Date of Patent: Jun. 8, 2004

(54) PIEZOELECTRIC THIN FILM RESONATOR AND FREQUENCY VARIABLE RESONATOR USING THE RESONATOR

(75) Inventors: Kazuhide Abe, Kawasaki (JP); Naoko Yanase, Kawasaki (JP); Takaaki Yasumoto, Kawasaki (JP); Ryoichi Ohara, Yokohama (JP); Tatsuo Shimizu, Kawasaki (JP); Takashi Kawakubo, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/235,785

(22) Filed: Sep. 6, 2002

(65) Prior Publication Data
US 2003/0058065 A1 Mar. 27, 2003

(30) Foreign Application Priority Data
Sep. 21, 2001 (JP) .............................. 2001-288763

(51) Int. Cl.$^7$ .............................. H03H 9/15; H03H 9/54; H03H 3/04
(52) U.S. Cl. ........................ 333/188; 333/190; 310/357; 310/358
(58) Field of Search ................ 333/186–192; 310/322, 324, 334, 335, 357, 358, 363

(56) References Cited

U.S. PATENT DOCUMENTS

| | | | | |
|---|---|---|---|---|
| 4,451,753 A | * | 5/1984 | Ogawa et al. ............... 310/315 |
| 5,587,620 A | | 12/1996 | Ruby et al. .................. 310/346 |
| 5,739,563 A | | 4/1998 | Kawakubo et al. .......... 257/295 |
| 5,760,432 A | | 6/1998 | Abe et al. .................... 257/295 |
| 5,821,833 A | | 10/1998 | Lakin .......................... 333/187 |
| 5,889,299 A | | 3/1999 | Abe et al. .................... 257/295 |
| 6,060,818 A | | 5/2000 | Ruby et al. .................. 310/363 |
| 6,080,327 A | * | 6/2000 | Takenaka et al. ......... 252/62.9 R |
| 6,198,208 B1 | * | 3/2001 | Yano et al. .................. 310/358 |
| 6,437,484 B1 | * | 8/2002 | Nishimura et al. .......... 310/324 |
| 6,533,906 B2 | * | 3/2003 | Kawakubo et al. ..... 204/192.22 |
| 6,555,946 B1 | * | 4/2003 | Finder et al. ................ 310/324 |
| 6,583,688 B2 | * | 6/2003 | Klee et al. ................... 333/188 |

FOREIGN PATENT DOCUMENTS

| | | |
|---|---|---|
| JP | 2000-332569 | 11/2000 |
| JP | 2001-044794 | * 2/2001 |

OTHER PUBLICATIONS

Y. Yano, et al. "Epitaxial Growth and Dielectric Properties of BaTiO$^3$ Films on Pt Electrodes by Reactive Evaporation" Journal of Applied Physics, vol 76, No. 12, Dec. 15, 1994, pp. 7833–7838.

John D. Larson III, et al. "Power Handling and Temperature Coefficient Studies in FBAR Duplexers for the 1900 MHz PCS Band" 2000 IEEE Ultrasonics Symposium pp. 869–874.

K. M. Lakin, "Thin Film Resonators and Filters" 1999 IEEE Ultrasonics Symposium, pp. 895–906.

N. A. Pertsev, et al. "Effect of Mechanical Boundary Conditions on Phase Diagrams of Epitaxial Ferroelectric Thin Films" Physical Review Letters, vol. 80, No. 9, Mar. 2, 1998, pp. 1988–1991.

U.S. patent application Ser. No. 10/397,176, Kawakubo et al., filed Mar. 27, 2003.

U.S. patent application Ser. No. 09/749,788, filed Dec. 28, 2000, pending.

U.S. patent application Ser. No. 10/252,105, filed Sep. 23, 2002, pending.

* cited by examiner

*Primary Examiner*—Barbara Summons
(74) *Attorney, Agent, or Firm*—Oblon, Spivak, McClelland, Maier & Neustadt, P.C.

(57) ABSTRACT

A piezoelectric thin film resonator which comprises a first electrode, a second electrode, and a piezoelectric film which is interposed between the first electrode and the second electrode, and formed of an epitaxial ferroelectric thin film containing barium titanate, a spontaneous polarization of the epitaxial ferroelectric thin film being uniaxially orientated in a direction normal to a film surface.

26 Claims, 4 Drawing Sheets

PIEZOELECTRIC THIN FILM RESONATOR AND FREQUENCY VARIABLE RESONATOR USING THE RESONATOR

CROSS-REFERENCE TO RELATED APPLICATIONS

This application is based upon and claims the benefit of priority from the prior Japanese Patent Application No. 2001-288763, filed Sep. 21, 2001, the entire contents of which are incorporated herein by reference.

BACKGROUND OF THE INVENTION

1. Field of the Invention

This invention relates to a piezoelectric thin film resonator and also to a frequency variable resonator where this piezoelectric thin film resonator is employed.

2. Description of the Related Art

In recent years, the market for mobile communication devices including portable telephone is increasing, and at the same time, the services available through mobile communications are increasingly made versatile. Due to this versatility, there is a trend that the frequency band to be utilized by mobile communication devices is gradually shifted toward high frequencies of the order of gigahertz (GHz) or more.

As for the filter which is useful at such high-frequencies, a surface acoustic wave (SAW) device, or a dielectric resonator where a bulk dielectric substance is employed as a resonator has been generally utilized up to date.

However, due to the limitation in the fine working of comb-shaped electrodes, and in consideration of the reliability of this fine working, it is now considered that the shifting of the frequency band of the SAW device toward higher frequencies still more is nearly no longer possible.

On the other hand, the dielectric resonator where a bulk dielectric substance is employed as a resonator is defective in that the dielectric resonator is generally not suited to miniaturization, so that it is not suitable for utilization in a mobile communication device which is inherently required to be light and small.

With a view to overcoming these problems, a film bulk acoustic resonator (FBAR) where the acoustic vibration in the direction normal to the surface of a piezoelectric thin film is utilized has been recently proposed in U.S. Pat. Nos. 6,060,818, 5,587,620, and 5,821,833, some kinds of FBAR being already available on the market. It is possible, according to this FBAR, to filter a high-frequency band of the order of 2 GHz without necessitating the fine working which the aforementioned SAW device necessitates. Furthermore, this FBAR is advantageous in that it can be greatly miniaturized as compared with the dielectric resonator where a bulk dielectric substance is employed as a resonator.

As for specific examples of piezoelectric thin film that can be utilized in this FBAR and the like, it is known to employ a thin film formed of aluminum nitride (AlN) or zinc oxide (ZnO). However, although it is possible, according to the thin film formed of aluminum nitride or zinc oxide, to secure a relatively large magnitude of mechanical quality factor ($Q_m$), the thin film formed of aluminum nitride or zinc oxide is defective in that the electromechanical coupling coefficient (kt) with respect to the acoustic vibration in the direction normal to the surface of the thin film is relatively small and the band that can be filtered is relatively narrow.

It may be noted that the mechanical quality factor ($Q_m$) represents a magnitude of loss of elastic energy in resonance frequency, and can be represented by the following equation:

$$Q_m^{-1} = (f_2 - f_1)/f_0$$

Wherein $f_0$ is a frequency which makes the admittance become maximum in the vicinity of the resonance frequency, and $f_2$ and $f_1$ denote respectively a frequency which makes the admittance become a half of the maximum admittance.

Under the circumstances, it is now having attempted to employ a thin film of ferroelectric substance exhibiting a large electromechanical coupling coefficient such as lead titanate ($PbTiO_3$) or lead zirconate titanate (Pb(Zi, Ti)$O_3$:PZT). Since it is possible, according to these ferroelectric thin films, to obtain a large electromechanical coupling coefficient, it is expected to enlarge the frequency band of the filter.

However, since these ferroelectric thin films generally have a low mechanical quality factor, these ferroelectric thin films are defective in that the loss is increased.

There is also known an FBAR where a thin film made of aluminum nitride or zinc oxide is employed and which makes it possible to control the resonance frequency to a desired frequency through the application of an electric field onto a piezoelectric thin film. This FBAR employing aluminum nitride or zinc oxide is accompanied however with the problem that the voltage to be applied thereto is as high as 30 volts.

As explained above, according to the prior art, no-one has succeeded in providing a piezoelectric thin film resonator which is sufficiently large not only in electromechanical coupling coefficient but also in mechanical quality factor.

Further, according to the conventional piezoelectric thin film resonator, it is required to apply a very high voltage to a piezoelectric substance in order to make the frequency thereof variable.

BRIEF SUMMARY OF THE INVENTION

An object of the present invention is to provide a piezoelectric thin film resonator which is sufficiently large not only in electromechanical coupling coefficient but also in mechanical quality factor.

According to one aspect of the present invention, there is provided a piezoelectric thin film resonator which comprises:

a first electrode;

a second electrode; and a piezoelectric film which is interposed between the first electrode and the second electrode, and formed of an epitaxial ferroelectric thin film containing barium titanate, a spontaneous polarization of the epitaxial ferroelectric thin film being uniaxially orientated in a direction normal to a film surface.

According to another aspect of the present invention, there is provided a piezoelectric thin film resonator which comprises:

a first electrode;

a second electrode; and a piezoelectric film which is interposed between the first electrode and the second electrode, and formed of an epitaxial ferroelectric thin film containing barium titanate, wherein a spontaneous polarization of the epitaxial ferroelectric thin film is uniaxially orientated in (001) azimuth and the in-plane two-dimensional lattice strain $x_m$ of the epitaxial ferroelectric thin film is confined to meet an expression of: xm>−0.025.

According to a further aspect of the present invention, there is provided a frequency variable resonator which is capable of resonating at a plurality of frequencies through changes of a bias electric field, the filter resonator comprising:

any one of the aforementioned piezoelectric thin film resonators; and a variable voltage source for applying a bias electric field between the aforementioned first and second electrodes.

According to a further aspect of the present invention, there is provided a piezoelectric thin film resonator which comprises:

a first electrode;

a second electrode; and a piezoelectric film which is interposed between the first electrode and the second electrode, and formed of an epitaxial ferroelectric thin film which has a perovskite-type crystal structure, a spontaneous polarization of the epitaxial ferroelectric thin film being uniaxially orientated in a direction normal to the film surface.

According to a further aspect of the present invention, there is provided a piezoelectric thin film resonator which comprises:

a first electrode;

a second electrode; and a piezoelectric film which is interposed between the first electrode and the second electrode, and formed of an epitaxial ferroelectric thin film which has a perovskite-type crystal structure, wherein a spontaneous polarization of the epitaxial ferroelectric thin film is uniaxially orientated in (001) azimuth and the in-plane two-dimensional lattice strain $x_m$ of the epitaxial ferroelectric thin film is confined to meet an expression of: $x_m$>−0.025.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Figure 1:
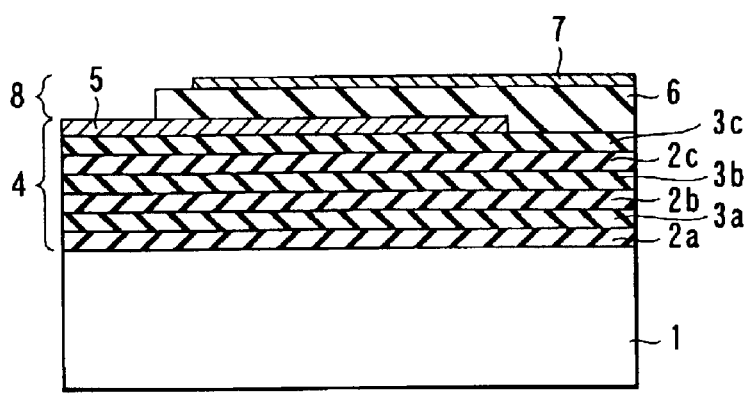
FIG. 1 is a cross-sectional view illustrating a piezoelectric thin film resonator according to one embodiment of the present invention.

The piezoelectric thin film resonator according to one aspect of the present invention is characterized in that it is provided, as the piezoelectric film thereof, with an epitaxial ferroelectric thin film containing barium titanate, wherein the spontaneous polarization of the epitaxial ferroelectric thin film is uniaxially orientated in the direction normal to the film thickness.

The piezoelectric thin film resonator according to another aspect of the present invention is characterized in that it is provided, as the piezoelectric film thereof, with an epitaxial ferroelectric thin film containing barium titanate, wherein the spontaneous polarization of the epitaxial ferroelectric thin film is uniaxially orientated in (001) azimuth and the in-plane two-dimensional lattice stain $x_m$ of the epitaxial ferroelectric thin film is confined to meet the expression $x_m$>−0.025.

It is preferable in these piezoelectric thin film resonators that the piezoelectric film thereof is epitaxially grown on the surface of a monocrystalline substrate having a cubic crystal structure or a tetragonal crystal structure.

According to one aspect of the present invention, since a ferroelectric material containing barium titanate is employed as the piezoelectric film thereof, and moreover, since the spontaneous polarization of the ferroelectric thin film is uniaxially orientated in the direction normal to the film thickness, it is now possible to realize a piezoelectric thin film resonator having a large electromechanical coupling coefficient which is comparable to one where a ferroelectric material such as lead titanate or lead zirconate titanate is employed.

The piezoelectric thin film resonator according to any one of the aforementioned aspects of the present invention is capable of sufficiently exhibiting the characteristics of barium titanate as described below.

First of all, since barium titanate is free from a low melting point metal such as lead which can be readily vaporized at a high temperature, the composition thereof can be easily controlled so as to have a stoichiometric composition. Therefore, it is possible to easily manufacture a thin film of high quality which is negligible in lattice defects as compared with the case where lead titanate or lead zirconate titanate is employed, thereby making it possible to obtain a piezoelectric thin film exhibiting a high mechanical quality factor.

Further, since it is possible, through the selection of the material of the underlying layer and the control of the conditions of growth of the thin film on the occasion of epitaxially growing barium titanate in the azimuth of (001), to spontaneously stabilize only the upward polarization, the poling treatment which has been considered indispensable on the occasion of utilizing a polycrystalline ferroelectric substance as a piezoelectric body can be dispensed with.

Additionally, barium titanate can be epitaxially grown in a state of uniaxial orientation aligned with the c-axis (c phase) where the direction of the spontaneous polarization is constituted by only the component which is orientated in the direction normal to the film surface, thereby making it possible to excite the resonator in a single vibration mode.

In any one of the aforementioned aspects of the present invention, the composition of the ferroelectric thin film may be such that it contains barium titanate as a main component, wherein the Ba/Ti ratio may preferably be close to 1 (or 1/1). However, if it is possible to secure a perovskite crystal structure, the Ba/Ti ratio may be deviated therefrom within the range of ±10% or so.

In any one of the aforementioned aspects of the present invention, if it is possible to secure a perovskite crystal structure, part of the Ba in barium titanate ($BaTiO_3$) may be replaced by an element such as Sr, Ca or Pb, and/or part of the Ti in barium titanate may be replaced by an element such as Zr or Hf.

In any one of the aforementioned aspects of the present invention, the film thickness of the ferroelectric thin film may preferably be confined within the range of 0.05 to 5 $\mu$m.

Further, in one aspect of the present invention, the in-plane two-dimensional lattice strain of the ferroelectric thin film that has been epitaxially grown is represented by $x_m$, and the range of this $x_m$ may preferably be larger than −0.025. As for the upper limit of this $x_m$, it may preferably be an upper limit in the range where the epitaxial growth can be maintained in a state of uniaxial orientation aligned with the c-axis (c phase) where the direction of the spontaneous polarization is constituted by only the component which is orientated in the direction normal to the film surface. More preferably, the value of this $x_m$ may be a negative value. This means that the magnitude of the lattice constant when barium titanate is formed into an epitaxial thin film, may be made smaller than the value of the a-axis of a cubic crystal which is an inherent lattice constant.

Incidentally, this $x_m$ can be represented by the following equation:

$$x_m = (a_f - a_{f0})/a_{f0}$$

$a_{f0}$: the length of the a-axis of a cubic crystal which is an inherent lattice constant; and $a_f$: the length of the a-axis of a tetragonal crystal which is a lattice constant after the epitaxial growth.

Incidentally, the crystal structure of barium titanate at a normal temperature (about 25° C.) is a tetragonal crystal, and an expression a<c is satisfied. The length $a_{f0}$ of a-axis of the cubic crystal used in the present invention is different from "a" and is defined by the cube root of $a^2c$ which is the volume of the lattice, that is, $a_{f0}=(a^2c)^{1/3}$.

Therefore, as described above, this $x_m$ may preferably be confined within the range $-0.025 < x_m < 0$.

As for the method of controlling the magnitude of the in-plane lattice strain, it is possible to employ a method wherein an underlying material exhibiting a different lattice constant or a different thermal expansion coefficient is suitably selected on the occasion of the epitaxial growth to thereby change the magnitude of the lattice strain of the ferroelectric film, or a method wherein the conditions of crystal growth are controlled on the occasion of the epitaxial growth to thereby change the magnitude of relaxing the lattice mismatch strain.

For example, it is possible to change the magnitude of strain to be introduced into the ferroelectric thin film by controlling the electric power to be applied to a target, the pressure of gas, the oxygen content in the gas, or the distance between the target and the substrate on the occasion of the epitaxial growth by means of sputtering.

The reasons for limiting the in-plane two-dimensional lattice strain represented by $x_m$ to greater than −0.025 as a preferable range are that if the in-plane two-dimensional lattice strain is smaller than −0.025, (1) the electromechanical coupling coefficient will become too small, thereby minimizing the advantage of employing the aforementioned ferroelectric thin film from a practical viewpoint, and (2) the magnitude of change in elastic stiffness will be minimized as a DC bias field is applied to the thin film, thus making it difficult to control the resonance or anti-resonance frequency by way of voltage.

As for the range for satisfying the in-plane lattice strain $x_m$, it is preferable that the thin film takes a state of uniaxial orientation aligned with the c-axis where the direction of the spontaneous polarization is constituted by only the component which is orientated in the direction normal to the film surface. Because if the direction of the spontaneous polarization takes a state where the in-plane component is partially included therein, or a state where the in-plane component is completely included therein, it would become difficult to bring about the excitation of single vertical vibration in the direction normal to the film thickness, thus making it unsuitable for use as a resonator.

Further, if the sign of the lattice strain $x_m$ is positive, it indicates that a tensile force is being applied to the ferroelectric thin film, thus raising a possibility of generating cracks in the thin film, thereby making it difficult to realize a resonator of a hollow structure.

These foregoing findings have been made clear by the present inventors as a result of theoretical simulation based on the thermodynamic phenomenology with regard to barium titanate. However, the present invention is not limited to the case where the piezoelectric film is formed of the epitaxial ferroelectric thin film containing barium titanate. It is possible to employ the epitaxial ferroelectric thin film containing lead titanate ($PbTiO_3$) as the piezoelectric film.

EXAMPLE 1

FIG. 1 is a cross-sectional view illustrating a piezoelectric thin film resonator according to Example 1 of the present invention.

Two kinds of acoustic impedance layers differing in acoustic impedance from each other, i.e. high acoustic impedance layers 2a, 2b and 2c, and low acoustic impedance layers 3a, 3b and 3c are alternately superimposed on the surface of a monocrystalline substrate 1 to thereby form a Bragg reflection layer 4 constituting an acoustic reflection part. Namely, this Bragg reflection layer 4 is constituted by these high acoustic impedance layers 2a, 2b and 2c, and low acoustic impedance layers 3a, 3b and 3c. These high acoustic impedance layers 2a, 2b and 2c, and low acoustic impedance layers 3a, 3b and 3c are respectively formed in such a manner that the thickness of each layer would become 1/4λ relative to the elastic wavelength λ in the resonance frequency of a piezoelectric resonator 8. It is possible in this manner to reflect this frequency.

On the surface of the Bragg reflection layer 4 is formed a first electrode 5, on which a ferroelectric thin film 6 containing barium titanate as a main component and uniaxially orientated in the film thickness-wise direction is formed. On this ferroelectric thin film 6 is formed a second electrode 7.

The piezoelectric resonator 8 is constituted by these first electrode 5, barium titanate thin film 6 and second electrode 7.

Each of the Bragg reflection layer 4, the first electrode 5, the barium titanate thin film 6 and the second electrode 7 can be successively formed by epitaxially growing it from the monocrystalline substrate 1.

As for the monocrystalline substrate 1, it is possible to employ a cubic crystal or a tetragonal crystal of a material selected from silicon (Si), magnesium oxide (MgO), strontium titanate ($SrTiO_3$), and lanthanum aluminate ($LaAlO_3$). By making use of this monocrystalline substrate 1, it is possible to improve the crystallinity of the barium titanate thin film 6. Additionally, it becomes possible to align the direction of the spontaneous polarization with the film thickness-wise direction.

As for the materials for the high acoustic impedance layers 2 and for the low acoustic impedance layers 3, it is preferable, in view of ensuring the crystallinity, to suitably combine perovskite-type oxides such as barium zirconate ($BaZrO_3$), barium magnesium tungstate ($Ba(Mg_{1/3}Ta_{2/3})O_3$, calcium titanate ($CaTiO_3$), etc.

As for the materials for the first electrode 5 and the second electrode 7, it is preferable, in view of improving the crystallinity of the barium titanate thin film 6, to employ noble metals such as platinum (Pt) and iridium (Ir), or conductive perovskite-type oxides such as strontium ruthenate ($SrRuO_3$).

These thin films can be formed by means of various kinds of film-forming methods such as a sputtering method, a sol-gel method, and a metal organic chemical vapor deposition (MO-CVD).

The crystal structure of the barium titanate thin film 6 can be analyzed by means of an X-ray diffraction method. For example, by making use of a tetra-axial X-ray apparatus, not only the lattice constant in the film thickness-wise direction of the thin film but also the information concerning the in-plane lattice constant of the thin film can be obtained.

It is also possible, through a suitable selection of the materials and manufacturing methods of the monocrystalline substrate 1, the Bragg reflection layer 4, and the first electrode 5, to change the conditions of the underlying layer on the occasion of epitaxially growing the barium titanate thin film 6.

It is especially important to suitably select the crystal orientation, surface smoothness and the surface lattice constant of the first electrode layer 5 with which the barium titanate thin film 6 is directly contacted on the occasion of epitaxially growing the barium titanate thin film 6.

Further, it is possible, depending on the various conditions on the occasion of epitaxially growing the barium titanate thin film 6, to change the magnitude of the strain to be introduced into the thin film. For example, if the thin film is to be formed by means of sputtering method, the strain in the thin film can be extremely changed depending on the electric power to be applied to a target, on the pressure of gas, on the oxygen content in the gas, or on the distance between the target and the substrate.

Since the piezoelectric thin film resonator according to this example has a structure which is mechanically strong owing to the monocrystalline substrate 1, it is called "solidly mounted resonator (SMR)". This SMR is structurally advantageous in the case where an epitaxial ferroelectric thin film having a large lattice strain is to be employed as a piezoelectric resonator.

It has been confirmed, through the tests made by the present inventors, that the piezoelectric thin film resonator according to this example was capable of achieving a very high electromechanical coupling coefficient ($kt^2$=0.15) and a very high mechanical quality factor ($Q_m$=1000).

EXAMPLE 2

Figure 2:
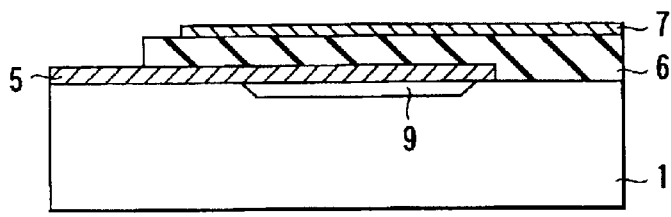
FIG. 2 is a cross-sectional view illustrating a piezoelectric thin film resonator according to another embodiment of the present invention.

FIG. 2 is a cross-sectional view illustrating a piezoelectric thin film resonator according to Example 2 of the present invention.

In this example, the piezoelectric resonator 8 constituted by the first electrode 5, the ferroelectric thin film 6 mainly consisting of barium titanate and uniaxially orientated in the film thickness-wise direction, and the second electrode 7 is formed on the surface of the monocrystalline substrate 1. Incidentally, the reference number 9 represents a cavity portion formed on the surface of the monocrystalline substrate 1. This cavity portion 9 provided on the surface of the monocrystalline substrate 1 functions as an acoustic reflection part of the resonance frequency in the piezoelectric resonator 8.

The piezoelectric thin film resonator according to this example can be manufactured by a process wherein a recessed portion is formed by any desired method at a region of the monocrystalline substrate 1 where the cavity portion 9 is to be formed, and after a sacrificial layer is selectively formed only on this recessed portion in advance, the first electrode 5, the ferroelectric thin film 6 and the second electrode 7 are successively formed on the surface of this sacrificial layer. Thereafter, this sacrificial layer is selectively etched away to form the cavity portion 9.

In this case, the sacrificial layer may be epitaxially grown on the surface of the monocrystalline substrate 1, and then, the first electrode 5 and the ferroelectric thin film 6 may be epitaxially grown on the surface of the epitaxial layer, thereby enabling the orientation of the barium titanate constituting the ferroelectric thin film 6 to align with the film thickness-wise direction.

In this example also, it is important to suitably select the crystal orientation, surface smoothness and the surface lattice constant of the first electrode layer 5 with which the barium titanate thin film 6 is directly in contact on the occasion of epitaxially growing the barium titanate thin film 6. However, these factors may be greatly influenced depending also on the material and manufacturing method of this sacrificial layer.

It has been also confirmed that the piezoelectric thin film resonator according to this example was capable of achieving a very high electromechanical coupling coefficient ($kt^2$=0.15) and a very high mechanical quality factor ($Q_m$=1000).

Figure 3:
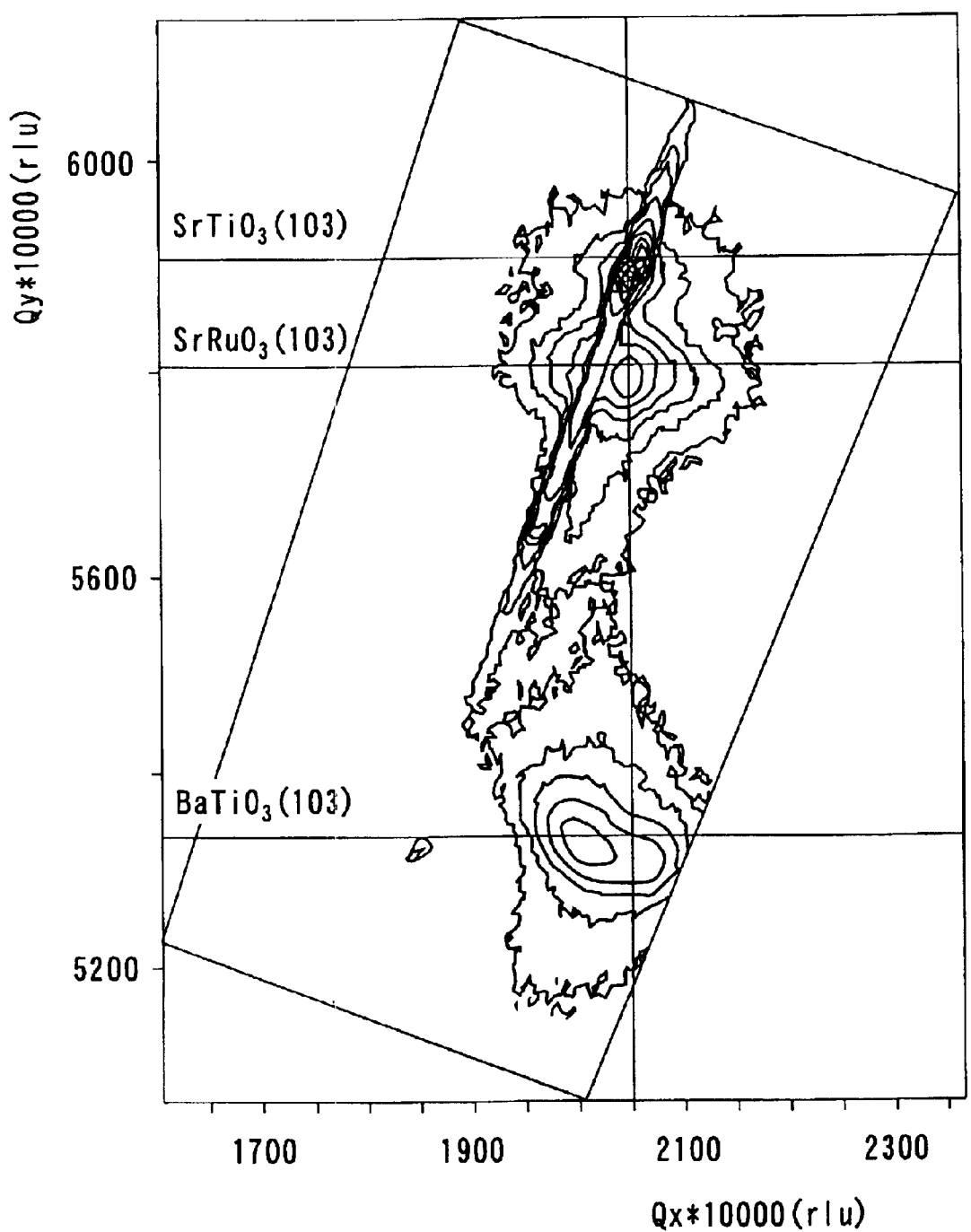
FIG. 3 represents a graph illustrating the X-ray diffraction pattern of a barium titanate thin film which was epitaxially grown according to one embodiment of the present invention.

FIG. 3 illustrates the results of the X-ray diffraction pattern of a barium titanate ($BaTiO_3$) thin film which was epitaxially grown, through a strontium ruthenate ($SrRuO_3$) film functioning as the first electrode, on the surface of the strontium titanate ($SrTiO_3$) monocrystalline substrate which was employed in the aforementioned Examples 1 and 2. In FIG. 3, the abscissa represents the lattice constant in in-plane direction of the thin film, while the ordinate represents the lattice constant in film thickness-wise direction of the thin film.

As shown in FIG. 3, the diffraction peak related to (103) of the barium titanate film was constituted by a single diffraction peak not only in the in-plane direction but also in the film thickness-wise direction. Further, the in-plane lattice constant of the barium titanate film was substantially identical with that of strontium titanate which was employed as the substrate. Whereas, the lattice constant in the film thickness-wise direction of the barium titanate film was prominently enlarged.

It is suggested from these results that the epitaxial film of the barium titanate was in the state of c phase where the spontaneous polarization was constituted by only the component which was orientated in the direction normal to the film surface. It is possible, due to this c phase film, to realize a piezoelectric resonator exhibiting a large quality factor Q because of the reason that a piezoelectric vibration of a single mode can be excited as a high frequency voltage is applied between the first electrode and the second electrode.

Figure 4:
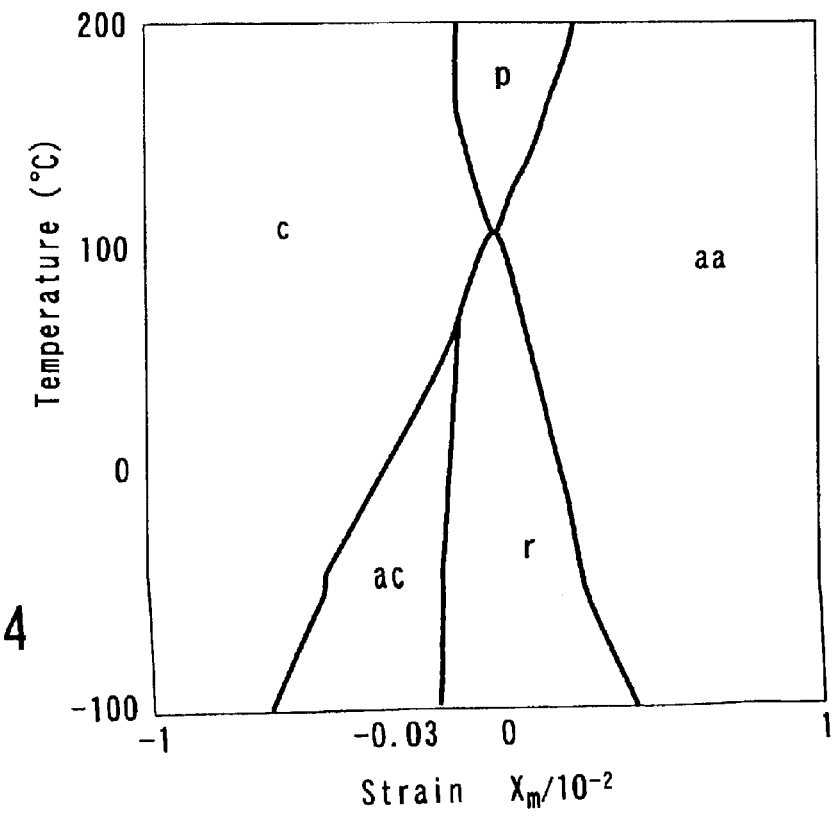
FIG. 4 represents a phase diagram of a barium titanate thin film which was epitaxially grown.

FIG. 4 represents a phase diagram of a barium titanate thin film which was epitaxially grown in the azimuth of (100), which has been determined from the calculation based on the thermodynamic phenomenology. In FIG. 4, the abscissa represents the magnitude of the in-plane lattice strain $x_m$ of the thin film wherein negative values indicate the shrinkage of the crystal lattice, while the ordinate represents the temperature of the thin film.

Incidentally, the crystal strain is defined herein as being based on the lattice constant as the thin film is assumed as being formed of cubic crystal (spontaneous polarization: zero).

The phase diagram that has been determined by the aforementioned calculation is expected to include errors due to the limitation of accuracy which is inherently involved in the theory itself as well as due to the inaccuracy of the parameters employed in the calculation, so that the aforementioned phase diagram is expected to differ more or less from the phase diagram of the thin film that has been actually produced.

In FIG. 4, the p phase represents the state of a paraelectric phase, c phase represents the state of a ferroelectric phase where the spontaneous polarization is constituted by only the component which was orientated in the direction normal to the film surface, r phase and ac phase represent the state of a ferroelectric phase where the spontaneous polarization is constituted by the component which was orientated in the direction normal to the film surface and by the component which was orientated in the in-plane direction, and aa phase represents the state of a ferroelectric phase where the spontaneous polarization is constituted by only the component which was orientated in the in-plane direction.

As shown in FIG. 4, it is preferable to employ the resonator under the condition where barium titanate is in the state of c phase representing a ferroelectric phase where the spontaneous polarization is constituted by only the component which is orientated in the direction normal to the film surface. It will be also seen from FIG. 4 that the value of $x_m$ may preferably be −0.03 or less at around normal temperature.

As described above, if an epitaxial ferroelectric thin film is to be employed, it may preferably be in the state of c phase where the spontaneous polarization is entirely orientated in the direction normal to the film surface. Therefore, if the in-plane lattice strain is represented by $x_m$, this $x_m$ may preferably be limited more or less to a small value in the standpoint of manufacturing a piezoelectric resonator.

Figure 5:
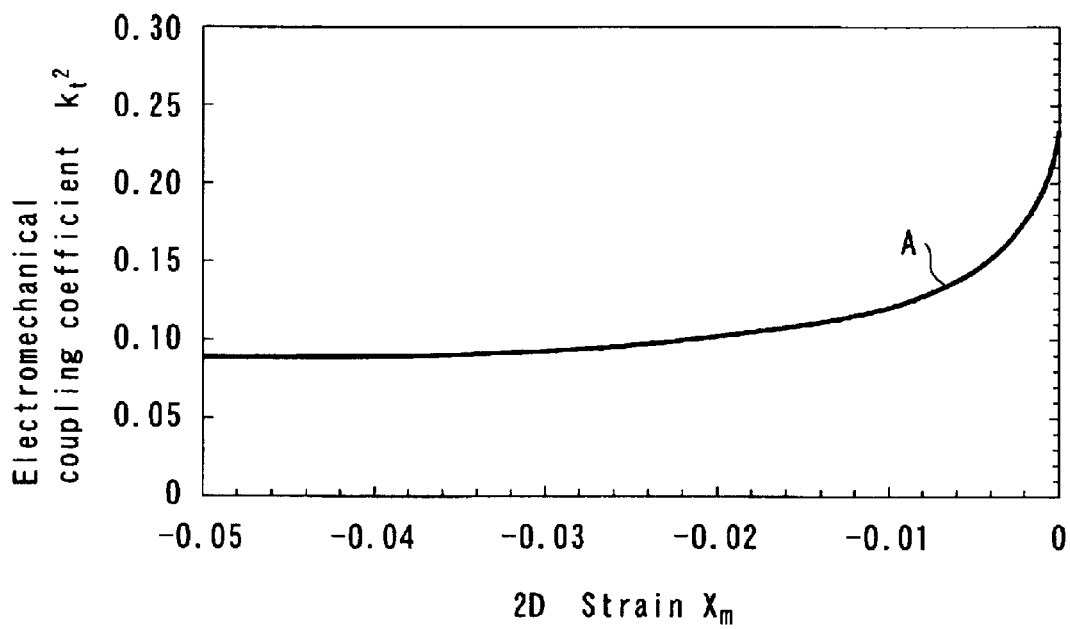
FIG. 5 is a graph illustrating the relationship between the in-plane lattice strain of a barium titanate thin film and the electromechanical coupling coefficient of the barium titanate thin film.

FIG. 5 is a graph illustrating the relationship between the in-plane lattice strain $x_m$ of barium titanate thin film as determined through calculations based on the thermodynamic phenomenology and the electromechanical coupling coefficient $kt^2$ related to the thickness-wise vertical vibration of the barium titanate thin film which has been epitaxially grown into the c phase.

As shown by the curved line A in FIG. 5, the smaller the absolute value of the strain $x_m$ is, the larger the electromechanical coupling coefficient $kt^2$ that can be obtained.

The piezoelectric thin film resonator utilizes the fact that it can be assumed as being equivalent to an inductor (coil) between the resonance frequency $f_R$ and anti-resonance frequency $f_A$. In the case of the thickness-wise vertical vibration, if a difference between the anti-resonance frequency $f_A$ and the resonance frequency $f_R$ is represented by $\Delta f$, the value of $\Delta f/f_A$ can be approximately represented by the following equation using the electromechanical coupling coefficient $kt^2$.

$$\Delta f/f_A = (4/\Delta f^2)kt^2$$

Frequency band width for application of the piezoelectric thin film resonator falls frequently within the range of 3 to 4% or so relative to the frequency of gigahertz band that is usually employed in the telecommunication such as portable telephone, most of it. Therefore, with this frequency band width being assumed as being 4%, when the value of the electromechanical coupling coefficient which is required for enabling the resonator to be assumed as being an inductor throughout this band is estimated from the aforementioned equation, it will be recognized that the value of $kt^2$ may preferably be 0.10 or more.

Therefore, it will be clear from FIG. 5 that in order to secure 0.10 or more as the value of electromechanical coupling coefficient $kt^2$, the in-plane lattice strain $x_m$ is required to be higher than −0.025.

Therefore, according to one embodiment of the present invention, the in-plane lattice strain $x_m$ of the barium titanate thin film is made larger than −0.025, thereby making it possible to obtain a sufficiently large magnitude of the electromechanical coupling coefficient $kt^2$ as compared with the piezoelectric thin film employing aluminum nitride (AlN) or zinc oxide (ZnO).

Figure 6:
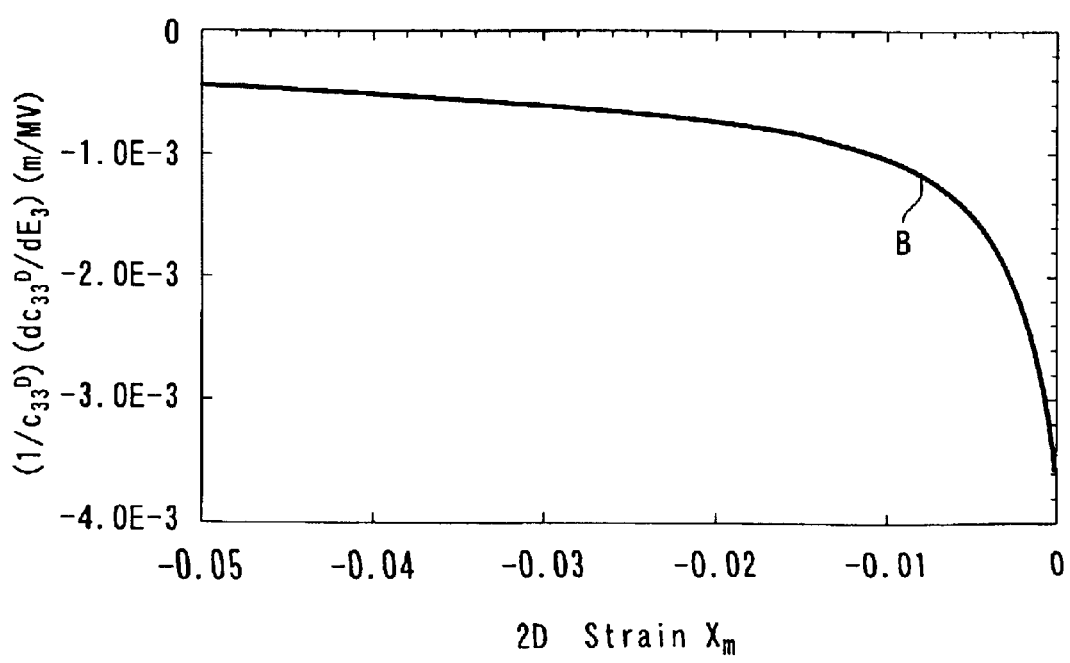
FIG. 6 is a graph illustrating the relationship between the in-plane lattice strain of a barium titanate thin film and the ratio of change in elastic stiffness per unit electric field.

FIG. 6 is a graph illustrating the relationship between the in-plane lattice strain $x_m$ of barium titanate thin film as determined through calculations based on the thermodynamic phenomenology and the rate of changes, relative to electric field $E_3$, of the elastic stiffness $c_{33}^D$ of the barium titanate thin film which has been uniaxially orientated and epitaxially grown into the c phase.

In the case of barium titanate, the magnitude of the elastic stiffness thereof is expected to be changed as the polarization thereof is changed. Therefore, FIG. 6 is intended to estimate how much the spontaneous polarization in the direction normal to the film surface to be generated due to the in-plane lattice strain can be changed by an externally applied unit electric field ($E_3=1$ MV/m), and to estimate how much the elastic stiffness can be changed by the changes in the spontaneous polarization.

As shown by the curved line B in FIG. 6, it is clear that as the magnitude of the strain is shifted closer to zero, the magnitude of the elastic stiffness is gradually minimized.

The anti-resonance frequency $f_A$ of the piezoelectric thin film resonator which makes use of the thickness-wise vertical vibration can be changed by the sonic velocity "v" propagating through the piezoelectric substance, i.e. by the density and elastic stiffness $c_{33}^D$ of the thin film. Since the density can be assumed as being constant, the anti-resonance frequency can be changed by changing the elastic stiffness.

Therefore, it will be recognized from FIG. 6 as to what degree the anti-resonance frequency $f_A$ can be changed by the application of external electric field, i.e. as to what extent the tunability can be secured.

As shown by the curved line B in FIG. 6, just like the electromechanical coupling coefficient, the tunability can be enlarged as the absolute value of the strain is minimized.

If the thickness of the barium titanate is set to 0.8 μm, and the first and second electrodes are fabricated from platinum (Pt) with the thickness thereof being confined to 0.1 μm, it is possible to obtain a piezoelectric thin film resonator about 2 GHz in anti-resonance frequency.

By making use of the results of the aforementioned calculation, when a DC voltage of ±4V (8 Vp-p) was applied to this piezoelectric thin film resonator so as to give a change of electric field of 10 MV/m at most, the elastic stiffness was changed by about 2%. Therefore, it is expected that the anti-resonance frequency would be caused to change by a half of the change of the elastic stiffness, i.e. by about 1% or about 20 MHz.

On the other hand, with respect to the technique of using a voltage for controlling the resonance frequency of the conventional piezoelectric thin film resonator where an aluminum nitride thin film is employed as the thin film of piezoelectric substance, there is known a case wherein the resonance frequency is changed by 1000 ppm, i.e. by 0.1% by making use of a voltage of ±30V (60 Vp-p).

By contrast, in the case of the frequency variable piezoelectric resonator according to one embodiment of the present invention, it is possible to realize a change of frequency which is ten times as large as that of the aforementioned conventional piezoelectric resonator by making use of a voltage which is as small as 1/7 of the voltage to be employed in the aforementioned conventional piezoelectric resonator.

As explained above, it has been found out by the present inventors that in order to confine the spontaneous polarization so as to be constituted by only the component which orientated in the direction normal to the film surface, it is preferable to employ a barium titanate thin film which has been epitaxially grown in the azimuth of (001) and uniaxially aligned with c-axis, and that in the case of the barium titanate thin film which has been epitaxially grown and uniaxially aligned with c-axis, the smaller the absolute value of the strain is, the larger the electromechanical coupling coefficient becomes, and still more, it is possible to provide a piezoelectric resonator which is capable of exhibiting a large ratio of change of resonance frequency by the application of a DC voltage.

Figure 7:
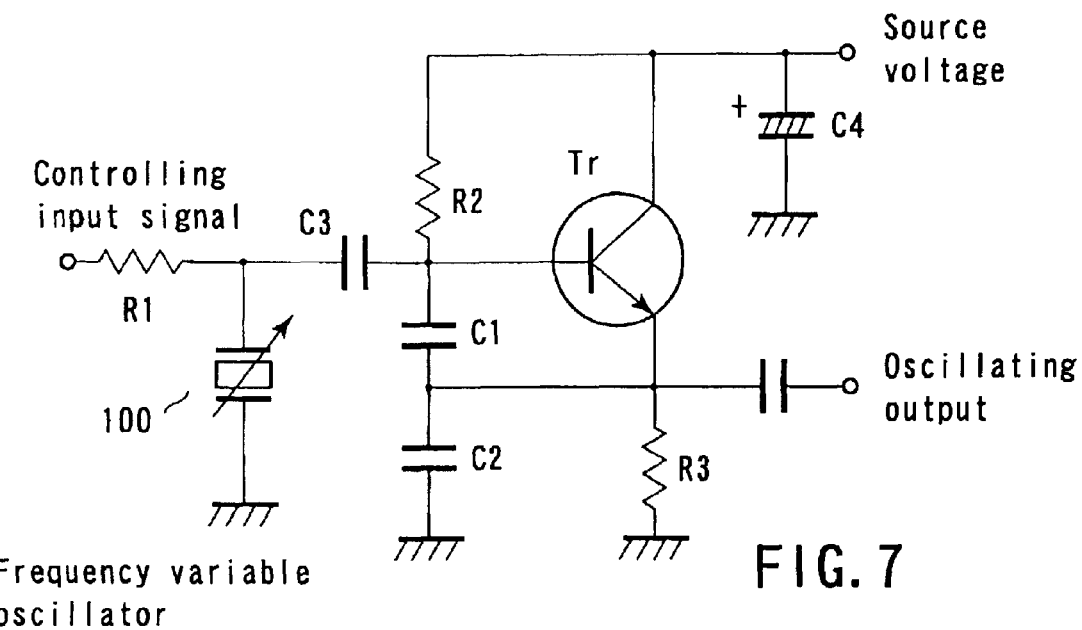
FIG. 7 is a circuit diagram illustrating the structure of a voltage controlled oscillator (VCO) wherein a piezoelectric thin film resonator according to one embodiment of the present invention is employed.

FIG. 7 illustrates one example of the structure of a voltage controlled oscillator (VCO) which makes use of a frequency variable piezoelectric thin film resonator wherein a barium titanate thin film which is uniaxially orientated and aligned with c-axis is employed.

This circuit is designed to oscillate at a frequency $f_0$ that can be determined not only by the resonance frequency of the frequency variable piezoelectric resonator but also by the capacitances C1, C2 and C3.

As shown in FIG. 7, this circuit is designed so as to constitute a Colpitts oscillator by making use of a transistor Tr and several peripheral passive elements.

The base and emitter of the transistor Tr are designed to be respectively applied with a DC bias voltage by way of the resistor R2 and R3. The collector of the transistor Tr is grounded in a high-frequency manner by way of a capacitance C4. A portion between the base and the emitter is connected with the capacitance C1, while a portion between the emitter and the ground is connected with the capacitance C2, thereby constituting a feed-back circuit.

The base of the transistor Tr is connected, via the capacitance C3, with a frequency variable piezoelectric thin film resonator 100 and is also grounded. This piezoelectric thin film resonator 100 is designed to be applied, via a resistance R1, with a DC voltage for controlling the frequency.

In this case, when a DC voltage is applied to the piezoelectric thin film resonator 100, the resonance frequency and anti-resonance frequency of the piezoelectric thin film resonator 100 is caused to change depending on the magnitude of voltage to be employed. Therefore, it is possible to change the oscillating frequency of the oscillating circuit, which will be determined not only by the aforementioned resonance frequencies but also by the capacitances C1, C2 and C3.

The aforementioned voltage controlled oscillator is capable of enabling a sufficiently wide range of frequency zone to become variable, and also capable of obtaining a stable oscillation. Still more, since this voltage controlled oscillator is capable of miniaturizing it, it is suited for miniaturizing wireless communication apparatuses such as a portable telephone.

The oscillating frequency of this oscillator can be changed by applying a controlling DC voltage, via the resistance R1, to the frequency variable piezoelectric resonator. Furthermore, since it is no longer required to employ a variable capacity diode as described above, it is advantageous in simplifying the construction of circuit.

Figure 8:
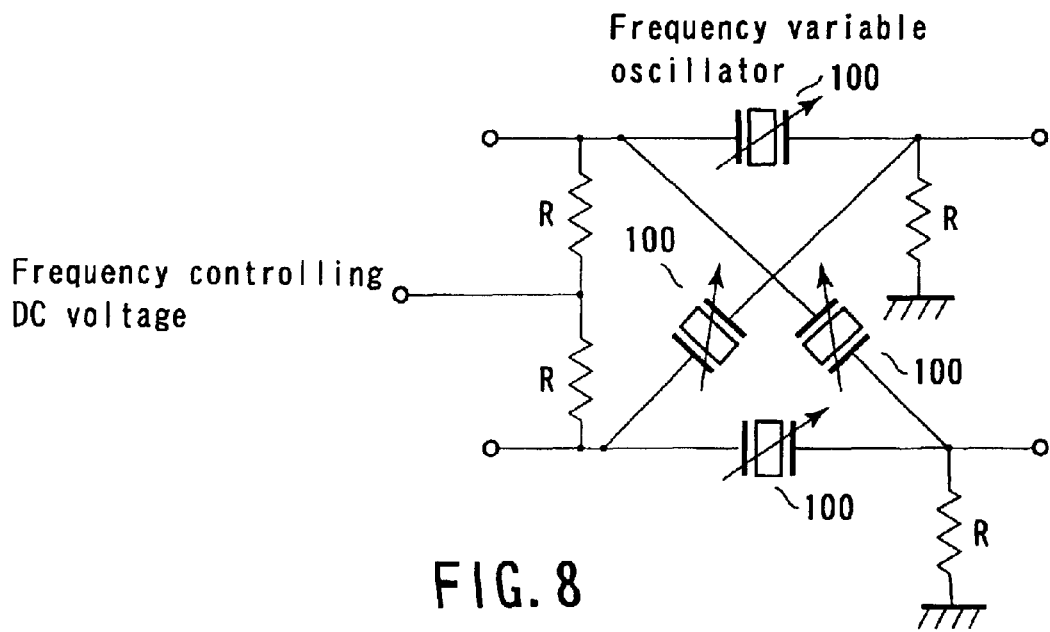
FIG. 8 is a circuit diagram illustrating the structure of a frequency filter wherein a piezoelectric thin film resonator according to one embodiment of the present invention is employed.

Further, the frequency variable piezoelectric resonator according to the present invention can be used for the manufacture of a frequency variable filter where the passing band can be controlled by changing a DC voltage. FIG. 8 illustrates one example of such a structure.

As shown in FIG. 8, this filter is constituted by a plurality of frequency variable piezoelectric thin film resonators 100 as proposed by the present invention, input terminals and output terminals. The both ends of each of the piezoelectric thin film resonators 100 are connected, via a resistance R, with a DC voltage terminal for controlling the frequency, or with the ground.

When a DC voltage is applied to a frequency controlling terminal, the DC voltage is transmitted to each of the piezoelectric thin film resonators 100, thereby causing the resonance frequency and anti-resonance frequency of the resonator to change correspondingly. As a result, the passing frequency band of the filter can be altered.

As mentioned above, it is possible, by making use of the piezoelectric resonator of the present invention, to obtain a filter of small size, which is wide in band and large in variable range, thereby making it possible to improve the performance of a wireless communication apparatus such as a portable telephone, and at the same time, to miniaturize the wireless communication apparatus.

As explained above, it is possible, according to various embodiments of the present invention, to provide a piezoelectric thin film resonator which is sufficiently large not only in electromechanical coupling coefficient but also in mechanical quality factor, and whose resonance frequency can be widely changed by the application of an external DC voltage.

Additional advantages and modifications will readily occur to those skilled in the art. Therefore, the invention is its broader aspects is not limited to the specific details and representative embodiments shown and described herein. Accordingly, various modifications may be made without departing from the spirit or scope of the general inventive concept as defined by the appended claims and their equivalents.

What is claimed is:

1. A piezoelectric thin film resonator which comprises:

a first electrode;

a second electrode; and a piezoelectric film which is interposed between said first electrode and said second electrode, and formed of an epitaxial ferroelectric thin film comprising barium titanate, a spontaneous polarization of said epitaxial ferroelectric thin film being uniaxially orientated in a direction normal to a film surface.

2. The piezoelectric thin film resonator according to claim 1, wherein said ferroelectric thin film has a perovskite crystal structure and comprises barium titanate having a Ba/Ti ratio of 1±0.1.

3. The piezoelectric thin film resonator according to claim 1, wherein said ferroelectric thin film has a perovskite crystal structure and comprises barium titanate where part of Ba is replaced by Sr, Ca or Pb.

4. The piezoelectric thin film resonator according to claim 1, wherein said ferroelectric thin film has a perovskite crystal structure and comprises barium titanate where part of Ti is replaced by Zr or Hf.

5. The piezoelectric thin film resonator according to claim 1, further comprising an acoustic reflector disposed closer to said first electrode than to said second electrode.

6. The piezoelectric thin film resonator according to claim 5, wherein said acoustic reflector is a Bragg reflection layer formed on a surface of a monocrystalline substrate and formed of a laminate structure comprising a high acoustic impedance layer and a low acoustic impedance layer which are alternately superimposed on each other.

7. The piezoelectric thin film resonator according to claim 6, wherein said monocrystalline substrate is formed of a cubic crystal or a tetragonal crystal and comprises a material selected from the group consisting of silicon, magnesium oxide, strontium titanate, and lanthanum aluminate.

8. The piezoelectric thin film resonator according to claim 5, wherein said acoustic reflector comprises a cavity portion formed on a surface of a monocrystalline substrate.

9. The piezoelectric thin film resonator according to claim 8, wherein said monocrystalline substrate is formed of a cubic crystal or a tetragonal crystal and comprises a material selected from the group consisting of silicon, magnesium oxide, strontium titanate, and lanthanum aluminate.

10. The piezoelectric thin film resonator according to claim 1, wherein said first electrode or said second electrode is formed of a noble metal or a conductive perovskite-type oxide.

11. The piezoelectric thin film resonator according to claim 10, wherein said noble metal is platinum or iridium, and said conductive perovskite-type oxide is strontium ruthenate.

12. A frequency variable resonator which is capable of resonating at a plurality of frequencies through changes of an electric field, said resonator comprising:
    said piezoelectric thin film resonator as claimed in claim 1; and
    a variable voltage source configured to apply the electric field between the first and second electrodes of said ferroelectric thin film resonator.

13. A piezoelectric thin film resonator which comprises:
    a first electrode;
    a second electrode; and
    a piezoelectric film which is interposed between said first electrode and said second electrode, and formed of an epitaxial ferroelectric thin film comprising barium titanate, wherein a spontaneous polarization of said epitaxial ferroelectric thin film is uniaxially orientated in (001) azimuth and an in-plane two-dimensional lattice strain $x_m$ of said epitaxial ferroelectric thin film is confined to meet an expression of: $x_m > -0.025$.

14. The piezoelectric thin film resonator according to claim 13, wherein said ferroelectric thin film has a perovskite crystal structure and comprises barium titanate where part of Ba is replaced by Sr, Ca or Pb.

15. The piezoelectric thin film resonator according to claim 13, wherein said ferroelectric thin film has a perovskite crystal structure and comprises barium titanate where part of Ti is replaced by Zr or Hf.

16. The piezoelectric thin film resonator according to claim 13, further comprising an acoustic reflector disposed closer to said first electrode than to said second electrode.

17. The piezoelectric thin film resonator according to claim 16, wherein said acoustic reflector is a Bragg reflection layer deposited on a surface of a monocrystalline substrate and formed of a laminate structure comprising a high acoustic impedance layer and a low acoustic impedance layer which are alternately superimposed with each other.

18. The piezoelectric thin film resonator according to claim 17, wherein said monocrystalline substrate is formed of a cubic crystal or a tetragonal crystal and comprises a material selected from the group consisting of silicon, magnesium oxide, strontium titanate, and lanthanum aluminate.

19. The piezoelectric thin film resonator according to claim 16, wherein said acoustic reflector comprises a cavity portion formed on a surface of the monocrystalline substrate.

20. The piezoelectric thin film resonator according to claim 19, wherein said monocrystalline substrate is formed of a cubic crystal or a tetragonal crystal and comprises a material selected from the group consisting of silicon, magnesium oxide and strontium titanate.

21. The piezoelectric thin film resonator according to claim 13, wherein said first electrode or said second electrode is formed of a noble metal or a conductive perovskite-type oxide.

22. The piezoelectric thin film resonator according to claim 21, wherein said noble metal is platinum or iridium, and said conductive perovskite-type oxide is strontium ruthenate.

23. The piezoelectric thin film resonator according to claim 13, wherein said ferroelectric thin film has a perovskite crystal structure and comprises barium titanate having a Ba/Ti ratio of 1±0.1.

24. A frequency variable resonator which is capable of resonating at a plurality of frequencies through changes of an electric field, said resonator comprising:
    said piezoelectric thin film resonator as claimed in claim 13, and
    a variable voltage source configured to apply an electric field between the first and second electrodes of said ferroelectric thin film resonator.

25. A piezoelectric thin film resonator which comprises:
    a first electrode;
    a second electrode; and
    a piezoelectric film which is interposed between said first electrode and said second electrode, and formed of an epitaxial ferroelectric thin film which has a perovskite-type crystal structure, a spontaneous polarization of said epitaxial ferroelectric thin film being uniaxially orientated in a direction normal to a film surface.

26. A piezoelectric thin film resonator which comprises:
    a first electrode;
    a second electrode; and
    a piezoelectric film which is interposed between said first electrode and said second electrode, and formed of an epitaxial ferroelectric thin film which has a perovskite-type crystal structure, wherein a spontaneous polarization of said epitaxial ferroelectric thin film is uniaxially orientated in (001) azimuth and an in-plane two-dimensional lattice strain $x_m$ of said epitaxial ferroelectric thin film is confined to meet an expression of: $x_m > -0.025$.

* * * * *